(12) United States Patent
Lin

(10) Patent No.: US 7,915,955 B2
(45) Date of Patent: Mar. 29, 2011

(54) BIAS BALANCING CIRCUIT

(75) Inventor: Wei-Cheng Lin, Yonghe (TW)

(73) Assignee: Amazing Microelectronic Corp., Jhonghe, Taipei County (TW)

( * ) Notice: Subject to any disclaimer, the term of this patent is extended or adjusted under 35 U.S.C. 154(b) by 0 days.

(21) Appl. No.: 12/508,126

(22) Filed: Jul. 23, 2009

(65) Prior Publication Data
US 2010/0060361 A1 Mar. 11, 2010

(30) Foreign Application Priority Data
Sep. 10, 2008 (TW) ................................ 97216339 U

(51) Int. Cl.
*H03G 3/12* (2006.01)
(52) U.S. Cl. ........................................ 330/282; 330/279
(58) Field of Classification Search .................. 330/282, 330/278, 279
See application file for complete search history.

(56) References Cited

U.S. PATENT DOCUMENTS

| | | | |
|---|---|---|---|
| 5,083,096 A * | 1/1992 | Miyazaki | 330/279 |
| 5,194,823 A * | 3/1993 | Wendt et al. | 330/137 |
| 6,788,138 B2 * | 9/2004 | Suzuki | 330/129 |
| 6,977,550 B2 * | 12/2005 | Ishida et al. | 330/279 |
| 7,495,513 B2 * | 2/2009 | Dally et al. | 330/279 |
| 7,595,692 B2 * | 9/2009 | Ishida | 330/279 |

* cited by examiner

*Primary Examiner* — Henry K Choe
(74) *Attorney, Agent, or Firm* — Patterson & Sheridan, LLP

(57) ABSTRACT

The invention discloses a bias balancing circuit. The bias balancing circuit is used for balancing an output voltage outputted by an amplifier module. The amplifier module has a variable gain. The bias balancing circuit comprises a comparator and a voltage selector. The comparator is used for comparing the output voltage and a reference voltage, to generate a comparison signal. The voltage selector is used for generating a selected voltage according to the comparison signal. When the variable gain is changed to result in an offset from the output voltage to the reference voltage, the bias balancing circuit is capable of balancing the output voltage toward the reference voltage by the selected voltage.

7 Claims, 6 Drawing Sheets

BIAS BALANCING CIRCUIT

BACKGROUND OF THE INVENTION

1. Field of the Invention

The present invention relates generally to a bias balancing circuit, and more particularly, the bias balancing circuit of the invention is capable of balancing a bias and eliminating the effect caused by the offset voltage while switching input signal sources.

2. Description of the Prior Art

In electronic circuit applications, a steady voltage source and current source often play very important roles. An unsteady voltage source will easily mislead an electronic component into wrong decision or erroneous judgment in accordance with the logic. For example, according to the regulations of a digital circuit, an n-type metal-oxide-semiconductor field-effect transistor (MOSFET) is conducted if the input voltage at the gate electrode of n-type MOSFET is 3.3 V (namely, high level); n-type MOSFET is not conducted if the input voltage is 0 V (namely, low level). While the input voltage at the gate electrode of n-type MOSFET is unsteady, then n-type MOSFET will easily judge a voltage slightly lower than 3.3 V as a lower level and results in a disconnection of the electronic device and therefore, lead to a wrong motion of the entire electronic circuit.

Additionally, the influence of bias on a digital circuit has an unexpected outcome at the output end caused by the bias. For example, if the input voltage of an operational amplifier is an alternating current as a sine wave with amplitude of 3 V, the magnifying power is 4, and the output voltage is 12 V, ideally the bias should be 6 V as a target value. When the bias is unsteady and the amplifier is not precise enough, the operational amplifier may output irregular waves or cause the distortion of waves. That proves that a steady voltage source and current source play important roles in electronic circuit fields.

Please refer to FIG. 1. FIG. 1 is a functional block illustrating the conventional motor sound process wafer 1. When users are switching different signal sources (sound sources), there is a gain in motor sound process wafer 1 corresponding to each of different signal sources. Beforehand, a power supply is needed for the operational amplifier (for generating gain) in motor sound process wafer 1. Generally, a dual power supply operational amplifier is mostly adopted. Under a dual power supply, the output signal of the dual power supply operational amplifier changes to and fro on the origin of 0 V. There are operational amplifiers with single power supply. As for cars, the output voltage of a single battery is 12 V, which is difficult to afford a dual power supply. Moreover, a dual power supply operational amplifier is more expensive, which means that a single power supply operational amplifier is more suitable for motor sound process wafer 1. When using a single power supply operational amplifier, adding an extra power supply voltage which is half as much as the origin power supply voltage is necessary at the end without input signal (the former grounding end) and taking the extra voltage as a bias for the operational amplifier. After adding the extra bias mentioned above, the output waveform of the operational amplifier changes to and fro on the ½Vcc (half as much as the power supply voltage). The main purpose of taking the input bias half as much as the operating voltage, is to get the maximum amplitude of output wave.

For ideal integrated circuit (IC) wafer, offset voltage is not expected while switching different input signal sources. However, offset voltage dose exist while switching different input signal sources of the general IC wafer, and the offset voltage often ranges from 1 mV to 10 mV. This situation may be caused by the leakage current of the cross-linked capacitance in front of the input buffer inside of the IC wafer, and also weather the circuit layout inside the IC wafer is appropriately operating in coordination or not. Generally, different input signal sources may couple with the input buffer of one-port amplifier or that of differential amplifier through the coupling capacitor. For example, while switching different input signal sources, gain stage may be switched from the input buffer of one-port amplifier to that of a differential amplifier. More particularly, because of the mismatch of the circuit layout of internal resistance inside the input buffer of the differential amplifier, the offset voltage is often greater than that of the input buffer of a one-port amplifier. If the amplified offset voltage goes through the gain stage to the volume stage, users will hear clearly the noise amplified by the gain stage while adjusting the volume.

When users switch the signal source then leading to the amplified gain, the offset voltage is amplified simultaneously. As for bias, it is very sensitive to the change of the voltage source. The fluctuation of the voltage source affects the change of bias. As everyone knows, bias is used for controlling electronic devices (such as transistor) to work on the region of users' requirement. So, while the bias is affected by the offset voltage to fluctuate, the working region of electronic devices changes with the unsteady bias. For example, when the target value of the bias drifts up, then the lower half of the output wave could be completely revealed but the upper half of the output wave would be cut off and could not be shown entirely. As illustrated in FIG. 1, the motor sound process wafer 1 has 28 pins. To eliminate the noise amplified by the gain stage while adjusting the volume, the capacitance 12 between pin 122 and pin 124 and the capacitance 14 between pin 142 and pin 144 are used to close off the bias to avoid the offset voltage affecting to the next stage (volume stage).

However, in the process of producing IC wafers, the package process occupies a large proportion of cost. If the number of pins could be diminished from 28 to 24 (diminish pin 122, pin 124, pin 142, and pin 144 as mentioned above), the cost of producing an IC wafer would be lessened. Therefore, how to diminish the capacitance 12 and the capacitance 14 while laying out the circuit, but still avoid the influence of offset voltage on bias, this is the main idea for low cost IC producing process.

Accordingly, the main aspect of the present invention is to provide a bias balancing circuit to balance the bias while switching input signal sources and eliminate the influence of offset voltage. By using the bias balancing circuit of the invention, the capacitances in the conventional IC wafer for separating the previous and the next bias could be replaced. Thus, not only the cost of the replaced capacitances could be avoided, but also the number of pins could be lessened to decrease the cost of the IC wafer considerably.

SUMMARY OF THE INVENTION

An aspect of the present invention is to provide a bias balancing circuit. The bias balancing circuit is used for balancing an output voltage outputted by an amplifier module. The amplifier module has a variable gain. The bias balancing circuit comprises a comparator and a voltage selector. The comparator is electrically connected to the amplifier module. The comparator is used for comparing the output voltage and a reference voltage, to generate a comparison signal. The voltage selector is electrically connected to the comparator and the amplifier module. The voltage selector is used for generating a selected voltage according to the comparison signal. When the variable gain is changed to result in an offset from the output voltage to the reference voltage, the bias balancing circuit is capable of balancing the output voltage toward the reference voltage by the selected voltage.

Accordingly, the bias balancing circuit of the invention is to balance the bias while switching input signal sources and eliminate the influence of offset voltage. Thus, the capacitances in the conventional IC wafer for separating the previous and the next bias could be replaced. Moreover, the number of pins could be lessened to decrease the cost of IC wafers considerably.

The objective of the present invention will no doubt become obvious to those of ordinary skill in the art after reading the following detailed description of the preferred embodiment, which is illustrated in the various figures and drawings.

BRIEF DESCRIPTION OF THE APPENDED DRAWINGS

DETAILED DESCRIPTION OF THE INVENTION

The present invention provides a bias balancing circuit, and more particularly, the bias balancing circuits of the invention is capable of balancing a bias and eliminates the effect caused by the offset voltage while switching input signal sources. By means of the bias balancing circuit of the present invention, not only the cost of the replaced capacitances could be avoided, but also the number of pins could be lessened to decrease the cost of IC wafer considerably. The objective of the present invention will be illustrated in the following detailed description of the preferred embodiment.

Figure 1:
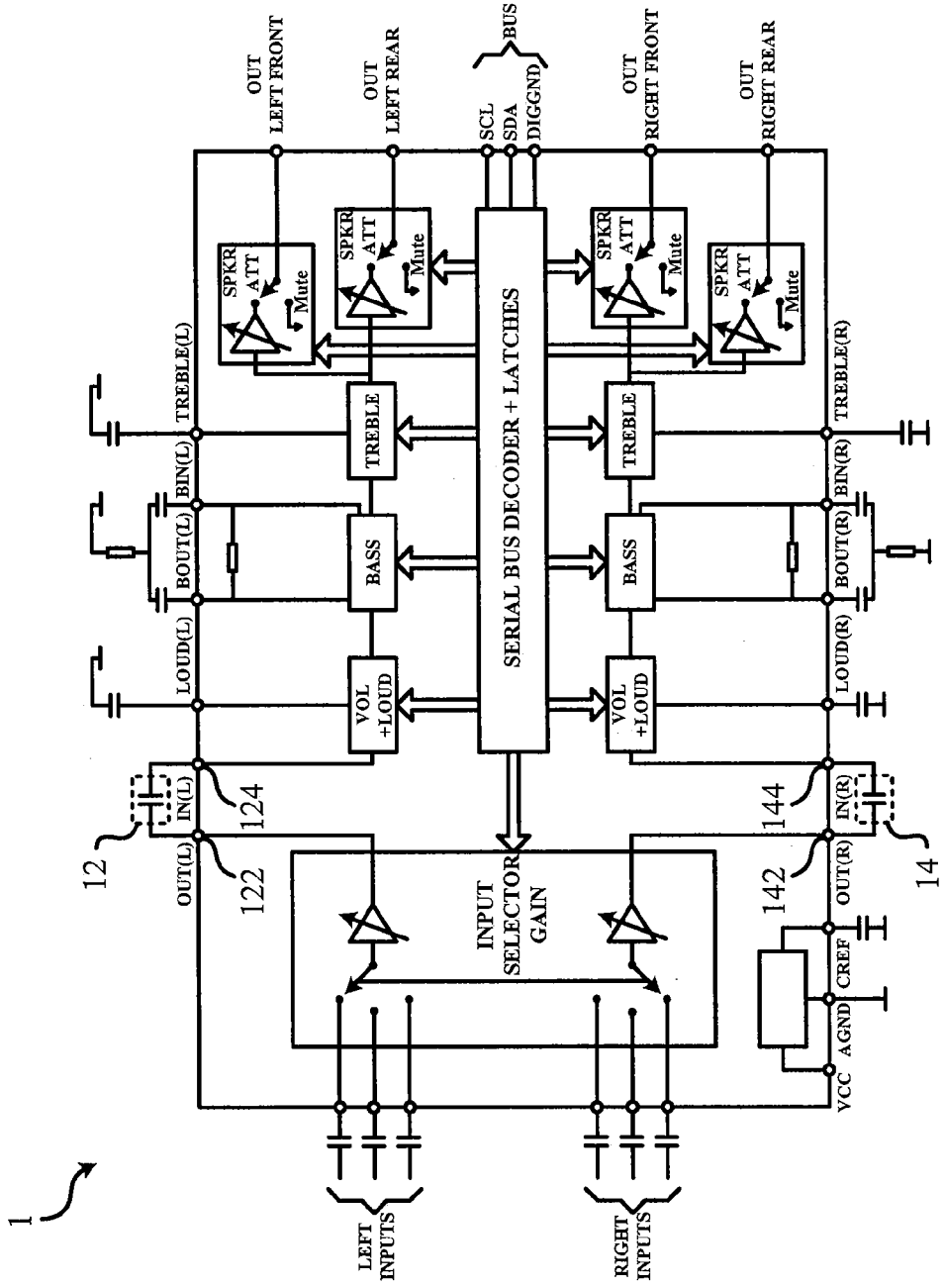
FIG. 1 is a functional block illustrating a conventional motor sound process wafer.
Figure 2:
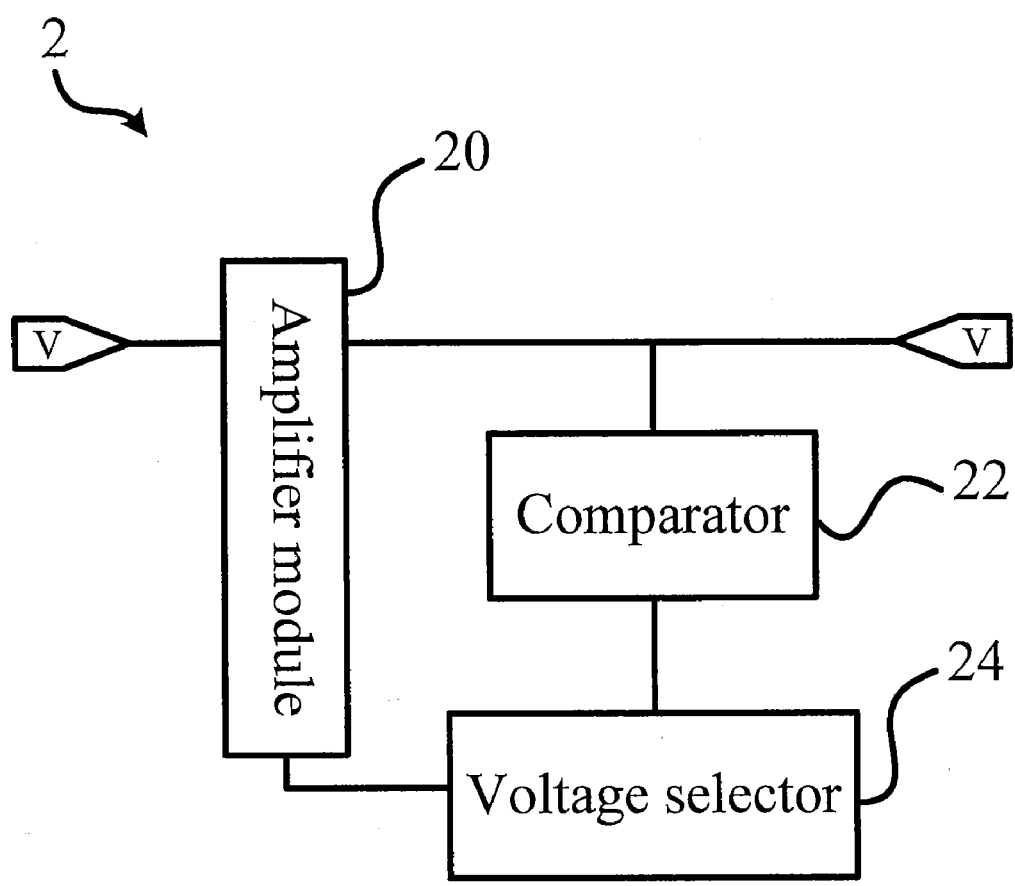
FIG. 2 is a functional block illustrating a bias balancing circuit according to an embodiment of the invention.

Please refer to FIG. 2. FIG. 2 is a functional block illustrating a bias balancing circuit 2 according to an embodiment of the invention. As shown in FIG. 2, the main purpose of the bias balancing circuit 2 of the invention is for balancing an output voltage outputted by an amplifier module 20. As everyone knows, the amplifier module 20 changes its variable gain correspondingly while switching signal sources. However, the offset voltage fluctuates inevitably which is affected by the output voltage. Accordingly, what is special about the bias balancing circuit 2 of the invention is to carry out its function directed against the amplifier module 20 with variable gain.

As illustrated in FIG. 2, the bias balancing circuit 2 comprises a comparator 22 and a voltage selector 24. The comparator 22 is electrically connected to the amplifier module 20. The comparator 22 is used for comparing the output voltage outputted by the amplifier module 20 and a reference voltage, so as to generate a comparison signal. The voltage selector 24 is electrically connected to the comparator 22 and the amplifier module 20. The voltage selector 24 is used for generating a selected voltage according to the comparison signal. The bias balancing circuit 2 of the invention is capable to carry out its function as expected, because the bias balancing circuit 2 is capable of balancing the output voltage toward the reference voltage by the selected voltage while changing the variable gain of the amplifier module 20 then resulting in an offset from the output voltage to the reference voltage. A detailed description of the bias balancing circuit 2 of the preferred embodiment will be illustrated as the following, comprising the structure of every part and its function and operating method.

Figure 3A:
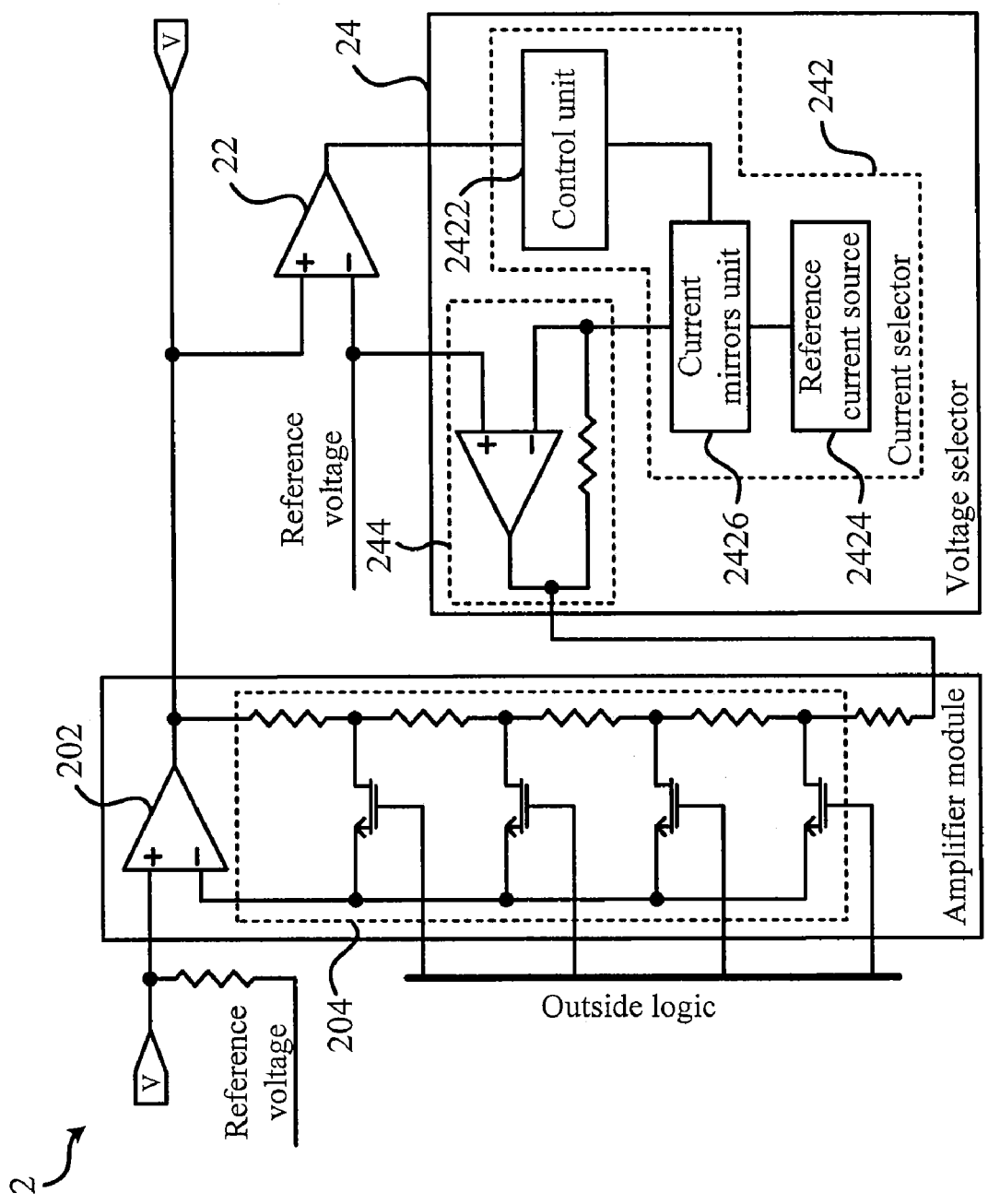
FIG. 3A is a circuit diagram illustrating a bias balancing circuit according to the first preferred embodiment of the invention.

Please refer to FIG. 3A. FIG. 3A is a circuit diagram illustrating a bias balancing circuit 2 according to the first preferred embodiment of the invention. As shown is FIG. 3A, the voltage selector 24 comprises a current selector 242 and a current-voltage transducer 244. The current selector 242 is electrically connected to the comparator 22, for generating a selected current according to the comparison signal produced by the comparator 22. The current-voltage transducer 244 is electrically connected to the current selector 242 and the amplifier module 20 respectively, for generating a selected voltage according to the selected current outputted by the current selector 242 as expected. Attention, the voltage selector 24 mentioned above could comprise not only the current selector 242 and the current-voltage transducer 244 above. Any device which is able to provide the function of selectivity of voltage source reaches the purpose of the invention.

In the embodiment, the current selector 242 comprises a control unit 2422, a reference current source 2424, and a current mirrors unit 2426 as shown in FIG. 3A. The control unit 2422 is electrically connected to the comparator 22. The control unit 2422 is for determining a magnifying power according to the comparison signal produced by the comparator 22. The reference current source 2424 is for supplying steady current. Particularly, the reference current source 2424 is not affected by the other electronic devices to be independent of the other circuit and provide steady current. The current mirrors unit 2426 is electrically connected to the control unit 2422 and the reference current source 2424 respectively. The current mirrors unit 2426 is for generating the selected current according to the magnifying power generated by the control unit 2422 and the steady current generated by the reference current source 2424. After the control unit 2422 generates a specific magnifying power, a stationary power supply generated by a stationary voltage source could be transformed to a specific amplified selected current according to the directives of the magnifying power, by means of the designed current mirrors unit 2426. Subsequently, the selected current is outputted to the current-voltage transducer 244. Attention, the current selector 242 mentioned above could comprise not only the control unit 2422, the reference current source 2424, and the current mirrors unit 2426 above. Any device which is able to provide the function of selectivity of current source reaches the purpose of the invention.

Please refer to FIG. 3A again, the amplifier module 20 comprises an operational amplifier 202 and a gain selector 204. The gain selector 204 is electrically connected to the operational amplifier 202. The gain selector 204 is mainly for determining the variable gain. For example, when users are switching input signal sources, the gain selector 204 could be controlled correspondingly by means of logic to get the expected variable gain in accordance with the input signal sources.

Figure 3B:
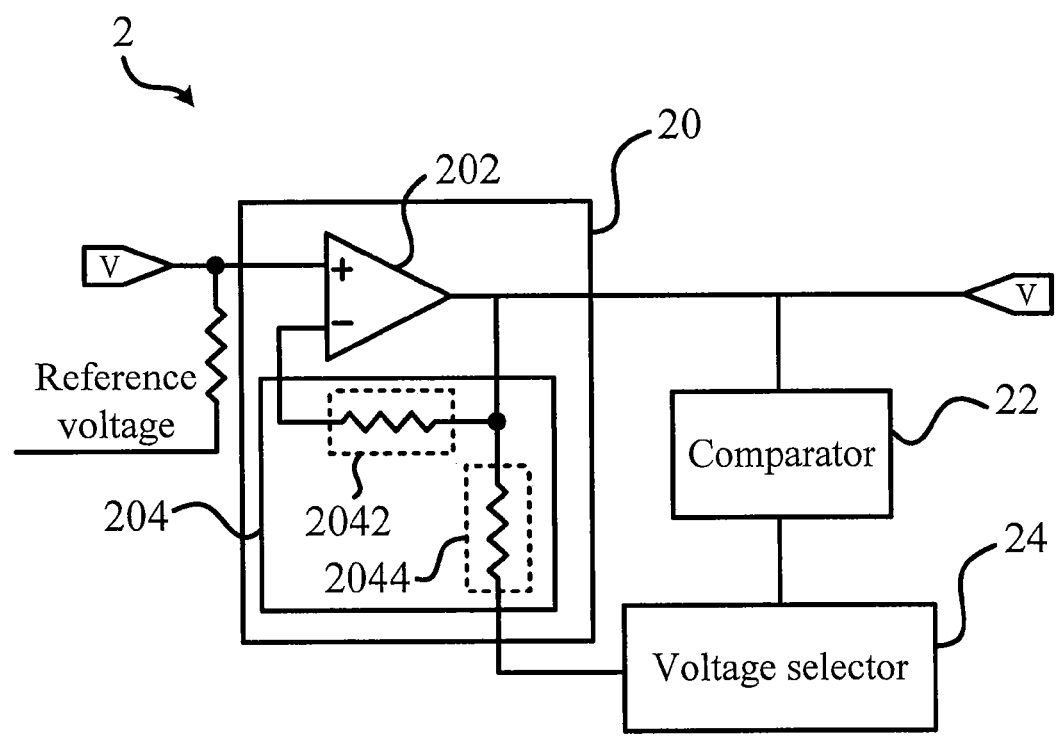
FIG. 3B illustrates the connections between the amplifier module in FIG. 3A and each device.

To make the amplifier module 20 reach the function mentioned above, the circuit inside of the amplifier module 20 could be laid out as the following according to an embodiment. As shown in FIG. 3A, the operational amplifier 202 has an in-phase input end, an anti-phase input end and an output end. The reference voltage is inputted to the in-phase input end of the operational amplifier 202. The gain selector 204 is electrically connected to the anti-phase input end and the output end of the operational amplifier 202 respectively. The comparator 22 is electrically connected to the output end of the operational amplifier 202. And the voltage selector 24 is electrically connected to the gain selector 204. Please refer to FIG. 3B. FIG. 3B illustrates the connections between the amplifier module in FIG. 3A and each device. In the preferred embodiment, after determining the variable gain, the gain selector 204 is capable of forming a first equivalent resistance 2042 and a second equivalent resistance 2044. The first equivalent resistance 2042 is electrically connected to the anti-phase input end and the output end of the operational amplifier 202 respectively. The second equivalent resistance 2044 is electrically connected to the anti-phase input end of the operational amplifier 202 and the voltage selector 24 respectively. By means of logical control, the value of the first equivalent resistance 2042 and the second equivalent resistance 2044 could be changed to get the expected variable gain.

Figure 4A:
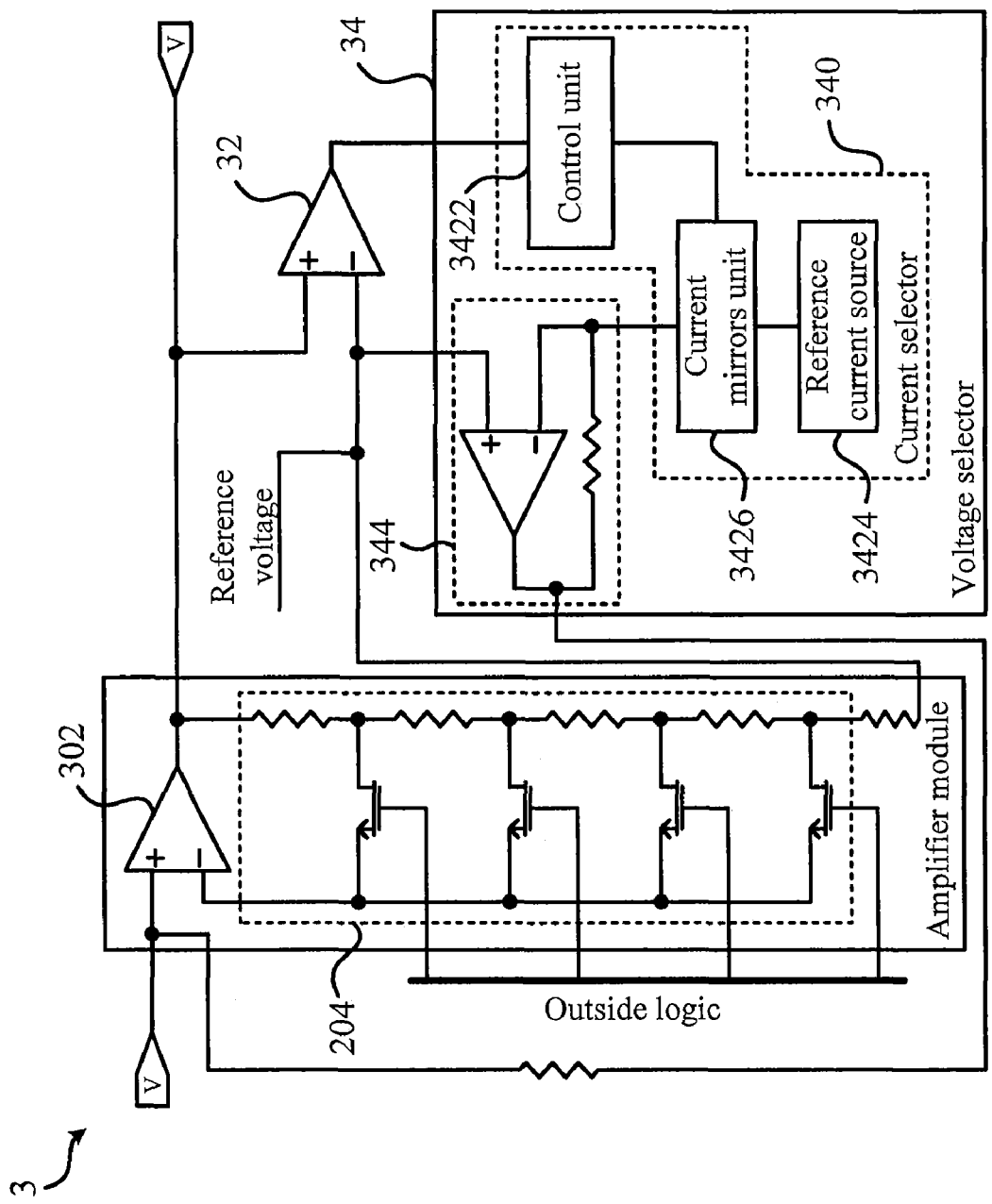
FIG. 4A is a circuit diagram illustrating a bias balancing circuit according to the second preferred embodiment of the invention.
Figure 4B:
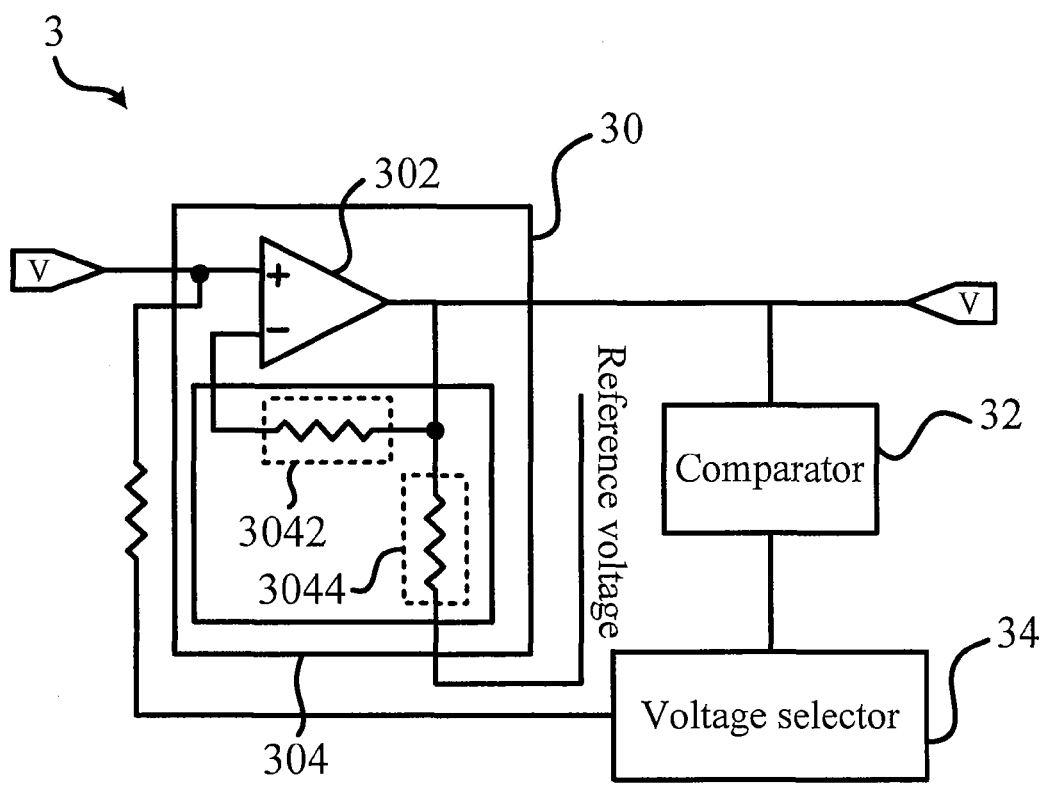
FIG. 4B illustrates the connections between the amplifier module in FIG. 4A and each device.

Similarly, to make the amplifier module 20 reach the function mentioned above, the circuit inside of the amplifier module 20 could be laid out as the structure shown in FIG. 4A. FIG. 4A is a circuit diagram illustrating a bias balancing circuit 3 according to the second preferred embodiment of the invention. As illustrated in FIG. 4A, the operational amplifier 302 has an in-phase input end, an anti-phase input end and an output end. The gain selector 304 is capable of forming a first equivalent resistance 3042 and a second equivalent resistance 3044. All of the electronic devices located inside of the voltage selector 34 are the same as the first preferred embodiment, the details are not described again here. The differences between the bias balancing circuit 3 of the preferred embodiment and the bias balancing circuit 2 of the first preferred embodiment are described as the following. Please refer to FIG. 4B. FIG. 4B illustrates the connections between the amplifier module in FIG. 4A and each device. In the embodiment, the voltage selector 34 is electrically connected to the in-phase input end of the operational amplifier 302; the gain selector 304 is electrically connected to the anti-phase input end and the output end of the operational amplifier 302 respectively; the comparator 32 is electrically connected to the output end of the operational amplifier 302; and the reference voltage is inputted to the gain selector 304. Moreover, the first equivalent resistance 3042 is electrically connected to the anti-phase input end and the output end of the operational amplifier 302 respectively; the second equivalent resistance 3044 is electrically connected to the anti-phase input end of the operational amplifier 302. And the reference voltage is inputted to the gain selector 304 through the second equivalent resistance 3044. Similarly, by means of logical control, the value of the first equivalent resistance 3042 and the second equivalent resistance 3044 could be changed to get the expected variable gain.

A practical example of the bias balancing circuit 2 according to the first preferred embodiment of the invention will be described as the following. When users' input signal is switched from broadcasting to CD player, the gain selector 204 of the amplifier module 20 can be driven to select the gain corresponding to the CD player by means of the logic outside. After the input signal amplified by the operating amplifier 202 according to the gain of the CD player, the output voltage may diverge from the reference voltage (for example, half as much as the power supply voltage, $\frac{1}{2}$ Vcc). Meanwhile, in a first working period t1 of the bias balancing circuit 2 according to the invention, the comparator 22 inside proceeds to compare the output voltage outputted by the amplifier module 20 and the reference voltage. When the judged output voltage judged by the comparator 22 is larger than the reference voltage, the comparison signal is produced and sent to the control unit 2422. For example, the control unit 2422 would determine that the magnifying power is 2 according to the received comparison signal. If the magnifying power produced by the control unit 2422 is 2, stationary power supply generated by a stationary voltage source is transformed to a doubled selected current according to the directives of the magnifying power of 2, by means of the designed current mirrors unit 2426. Subsequently, the doubled selected current is outputted to the current-voltage transducer 244. After the transformed by the current-voltage transducer 244, the selected current is transformed to the selected voltage. Because the current-voltage transducer 244 is electrically connected to the gain selector 204, it is capable of directly affecting the output voltage outputted by the amplifier module 20 to lower the output voltage. After that, a second working period t2 of the bias balancing circuit 2 is processed.

Similarly, after the second working period t2 has started, the comparator 22 inside compares the output voltage and the reference voltage. Two situations could happen at this time. The first situation is that the judged output voltage judged by the comparator 22 is roughly equal to the reference voltage; the second situation is the judged output voltage judged by the comparator 22 is still not equal to the reference voltage. If the first situation happens, that means the output voltage is balanced to the required reference voltage by means of the feedback from the elected voltage, then the bias balancing circuit 2 of the invention maintains the elected voltage without any change. If the second situation happens, then the bias balancing circuit 2 of the invention selects another selected voltage (namely, select the magnifying power of the selected current) and repeats all the processes in the first working period t1. That proves if only the comparison result from the comparator 22 is the second situation mentioned above, the bias balancing circuit 2 of the invention would select another selected voltage continuously until the first situation happens.

In summary, the bias balancing circuit of the invention is capable of balancing a bias and eliminating the effect caused by the offset voltage while switching input signal sources. The capacitances in the conventional IC wafer for separating the previous and the next bias could be replaced by means of the bias balancing circuit of the invention. Thus, not only the cost of the replaced capacitances could be avoided, but also the number of pins could be lessened to decrease considerably the cost of IC wafer.

Although the present invention has been illustrated and described with reference to the preferred embodiment thereof, it should be understood that it is in no way limited to the details of such embodiment but is capable of numerous modifications within the scope of the appended claims. Thus, not only the cost of the replaced capacitances could be avoided, but also the number of pins could be lessened to decrease considerably the cost of IC wafer.

What is claimed is:

1. A bias balancing circuit for balancing an output voltage outputted by an amplifier module which has a variable gain, and the bias balancing circuit comprising:

a comparator, electrically connected to the amplifier module, for comparing the output voltage and a reference voltage, to generate a comparison signal; and a voltage selector, electrically connected to the comparator and the amplifier module, for generating a selected voltage according to the comparison signal, wherein the voltage selector comprises a current selector, electrically connected to the comparator, for generating a selected current according to the comparison signal; and a current-voltage transducer, electrically connected to the current selector and the amplifier module respectively, for generating the selected voltage according to the selected current, wherein when the variable gain is changed to result in an offset from the output voltage to the reference voltage, the bias balancing circuit is capable of balancing the output voltage toward the reference voltage by the selected voltage.

2. The biasing circuit of claim 1, wherein the current selector comprises:

A control unit, electrically connected to the comparator, for determining a magnifying power according to the comparison signal;

a reference current source for supplying a steady current; and a current mirror unit, electrically connected to the control unit and the reference current source respectfully, for generating the selected current according to the magnifying power and the steady current.

3. The bias balancing circuit of claim 1, wherein the amplifier module comprises:

an operational amplifier; and a gain selector, electrically connected to the operational amplifier, for determining the variable gain.

4. The bias balancing circuit of claim 3, wherein the operational amplifier has an in-phase input end, an anti-phase input end and an output end; the reference voltage is inputted to the in-phase input end; the gain selector is electrically connected to the anti-phase input end and the output end respectively; the comparator is electrically connected to the output end; and the voltage selector is electrically connected to the gain selector.

5. The bias balancing circuit of claim 4, wherein the gain selector is capable forming a first equivalent resistance and a second equivalent resistance, the first equivalent resistance is electrically connected to the anti-phase input end and the output end respectively, and the second equivalent resistance is electrically connected to the anti-phase input end and the voltage selector respectively.

6. The bias balancing circuit of claim 3, wherein operational amplifier has an in-phase input end, an anti-phase input end and an output end; the voltage selector is electrically connected to the in-phase input end; the gain selector is electrically connected to the anti-phase input end and the output end respectively; the comparator is electrically connected to the output end; and the reference voltage is inputted to the gain selector.

7. The bias balancing circuit of claim 6, wherein the gain selector is capable of forming a first equivalent resistance and a second equivalent resistance, the first equivalent resistance is electrically connected to the anti-phase input end and the output end respectively, the second equivalent resistance is electrically connected to the anti-phase input end, and the reference voltage is inputted to the gain selector through the second equivalent resistance.

* * * * *